(12) United States Patent
Arvin et al.

(10) Patent No.: US 10,660,209 B2
(45) Date of Patent: May 19, 2020

(54) THIN FILM CAPACITORS FOR CORE AND ADJACENT BUILD UP LAYERS

(71) Applicant: International Business Machines Corporation, Armonk, NY (US)

(72) Inventors: Charles L. Arvin, Poughkeepsie, NY (US); Brian W. Quinlan, Poughkeepsie, NY (US); Charles L. Reynolds, Red Hook, NY (US); Jean Audet, Granby (CA); Francesco Preda, New Braunfels, TX (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 15/811,852

(22) Filed: Nov. 14, 2017

(65) Prior Publication Data

US 2019/0150287 A1    May 16, 2019

(51) Int. Cl.

| | | |
|---|---|---|
| H05K 1/18 | (2006.01) | |
| H01G 4/33 | (2006.01) | |
| H05K 1/11 | (2006.01) | |
| H05K 3/40 | (2006.01) | |
| H05K 3/00 | (2006.01) | |
| H05K 3/30 | (2006.01) | |
| H05K 1/16 | (2006.01) | |
| H05K 1/02 | (2006.01) | |

(52) U.S. Cl.
CPC ............ *H05K 1/185* (2013.01); *H01G 4/33* (2013.01); *H05K 1/0231* (2013.01); *H05K 1/115* (2013.01); *H05K 1/162* (2013.01); *H05K 1/181* (2013.01); *H05K 3/0047* (2013.01); *H05K 3/303* (2013.01); *H05K 3/4038* (2013.01); *H05K 2201/09581* (2013.01); *H05K 2201/10015* (2013.01); *H05K 2203/107* (2013.01)

(58) Field of Classification Search
CPC .......... H01G 4/33; H05K 1/115; H05K 1/181; H05K 1/185; H05K 2201/10015; H05K 2203/107
See application file for complete search history.

(56) References Cited

U.S. PATENT DOCUMENTS

| | | | |
|---|---|---|---|
| 5,162,977 A | 11/1992 | Paurus et al. | |
| 6,938,332 B2 * | 9/2005 | Harada | H01L 21/481 156/182 |

(Continued)

FOREIGN PATENT DOCUMENTS

| | | |
|---|---|---|
| JP | 2006303389 A | 11/2006 |
| JP | 4604939 B2 | 1/2011 |

*Primary Examiner* — Minh N Trinh
(74) *Attorney, Agent, or Firm* — Peter Edwards

(57) ABSTRACT

A method includes affixing a capacitor sheet adjacent to core material of a device substrate, where the capacitor sheet covers a surface of the core material. The method also includes patterning first openings through both capacitor sheet and the core material, where the first openings are larger than a substrate pass through-hole. The method additionally includes filling the first openings with an electrically inert material. The method further includes patterning a second openings parallel to the first openings through the electrically inert material, where the second openings are at least as large as the substrate pass through-hole and having sidewalls enclosed within the electrically inert material.

8 Claims, 4 Drawing Sheets

(56) References Cited

U.S. PATENT DOCUMENTS

| | | | |
|---|---|---|---|
| 7,078,788 B2 * | 7/2006 | Vu | H01L 21/56 |
| | | | 174/521 |
| 7,382,013 B2 | 6/2008 | Uchida et al. | |
| 7,687,366 B2 | 3/2010 | Min | |
| 7,791,897 B2 | 9/2010 | Das et al. | |
| 7,902,662 B2 | 3/2011 | Amey et al. | |
| 8,391,017 B2 | 3/2013 | McGregor et al. | |
| 8,607,445 B1 * | 12/2013 | Das | H01G 4/33 |
| | | | 29/25.42 |
| 9,076,600 B2 | 7/2015 | Yano et al. | |
| 9,420,693 B2 | 8/2016 | Sankman et al. | |
| 9,673,064 B2 * | 6/2017 | Audet | H01L 23/15 |
| 10,211,174 B2 * | 2/2019 | Audet | H01L 25/16 |
| 2007/0271752 A1 * | 11/2007 | Palanduz | H01G 4/12 |
| | | | 29/25.42 |
| 2008/0106844 A1 * | 5/2008 | Palanduz | H01G 4/1209 |
| | | | 361/303 |
| 2013/0010432 A1 | 1/2013 | Sundstrom et al. | |
| 2016/0329153 A1 | 11/2016 | Sankman et al. | |
| 2019/0150287 A1 * | 5/2019 | Arvin | H05K 1/185 |

* cited by examiner

THIN FILM CAPACITORS FOR CORE AND ADJACENT BUILD UP LAYERS

BACKGROUND

The present disclosure relates to electrical device substrates, and more specifically, to integrating thin film capacitor sheets adjacent to, and in place of, the core material of device substrates with substrate pass through-holes.

A substrate in the field of electronic device manufacturing and packaging is a substance on which one or more layers of another substance is deposited. The substrate can serve as a foundation for electronic circuits (e.g., a semiconductor device or chip), including active and passive electrical components. Pass through-holes can be cut in a substrate to electrically connect signals one surface of a substrate to signals on another surface of the substrate.

SUMMARY

According to embodiments of the present disclosure, a method includes affixing a capacitor sheet adjacent to core material of a device substrate, where the capacitor sheet covers a surface of the core material. The method also includes patterning first openings through both capacitor sheet and the core material, where the first openings are larger than a substrate pass through-hole. The method additionally includes filling the first openings with an electrically inert material. The method further includes patterning a second openings parallel to the first openings through the electrically inert material, where the second openings are at least as large as the substrate pass through-hole and having sidewalls enclosed within the electrically inert material.

According to various embodiments, a method for creating a device substrate includes generating a core structure of the device substrate, where the core structure comprising a capacitor sheet. The method then includes patterning a first openings through the core structure, where the first openings are larger than a substrate pass through-hole. The method further includes filling the first openings with an electrically inert material. The method further includes patterning a second openings through the electrically inert material, where the second openings are at least as large as the substrate pass through-hole and having sidewalls enclosed within the electrically inert material. The method additionally includes depositing one or more material layers on at least one surface of the core structure.

According to various embodiments, a device substrate includes a core material. A capacitor sheet can be affixed adjacent to a surface of the core material, where the capacitor sheet covers the surface of the core material. A first opening can extend through both capacitor sheet and the core material, where the first opening are larger than a substrate pass through-hole. An electrically inert material can fill the first opening. A second opening extending parallel to the first opening through the electrically inert material, where the second opening is at least as large as the substrate pass through-hole and having sidewalls enclosed within the electrically inert material.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
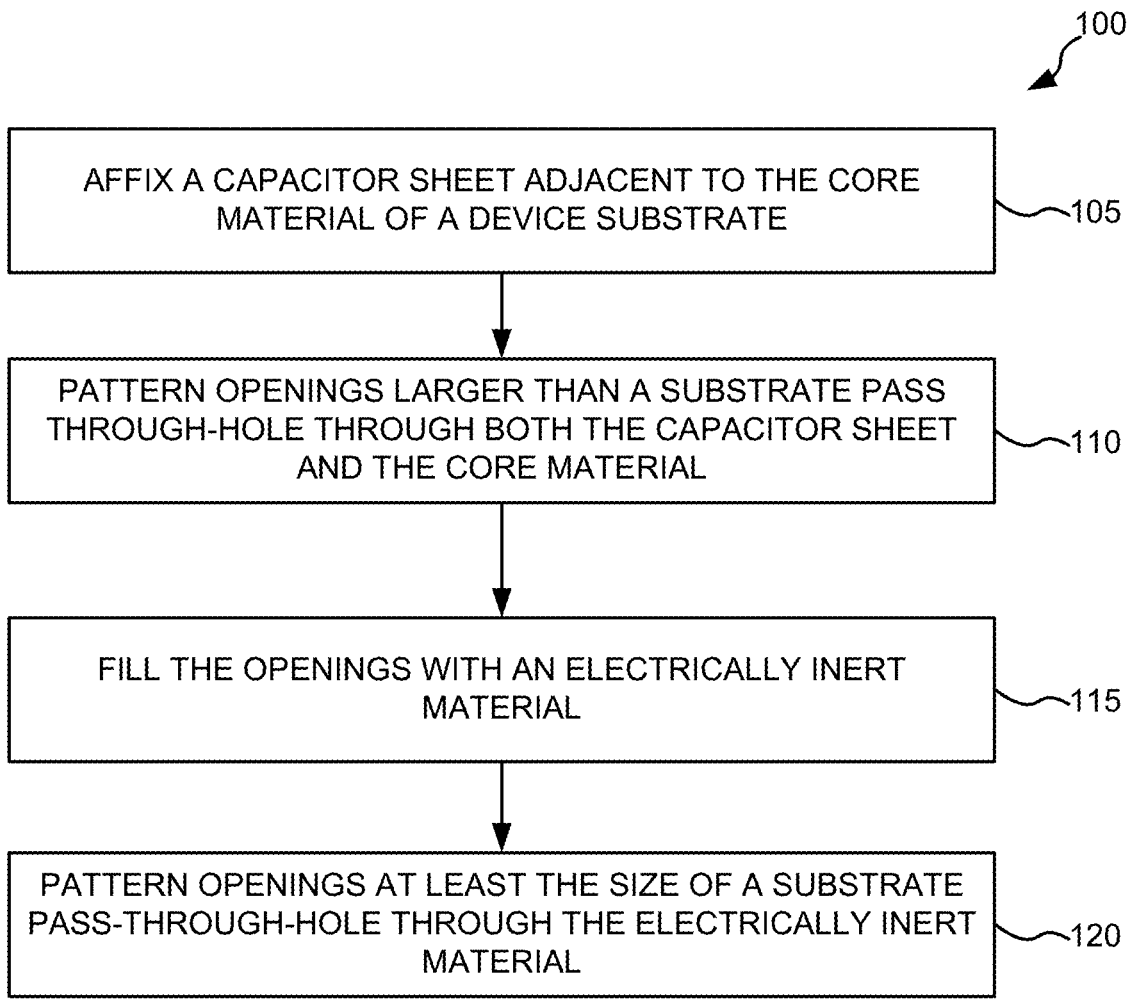
FIG. 1 depicts a set of operations for integrating thin film capacitor sheets adjacent to the core material of a device substrate, according to various embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to electrical device substrates, more particular aspects relate to integrating thin film capacitor sheets adjacent to, and in place of, the core material of device substrates with substrate pass through-holes. While the present disclosure is not necessarily limited to such applications, various aspects of the disclosure may be appreciated through a discussion of various examples using this context.

Functionality of an electrical device substrate (hereinafter, "substrate") can be degraded or limited due to, for example, noise (e.g., high frequency noise) and parasitic circuit characteristics (e.g., inductance). Capacitors can be added to a substrate, or to an electrical device package, to filter noise. These capacitors can also decouple different devices or circuits supported by a substrate to limit or attenuate the effect of some parasitic circuit characteristics. Adding capacitors (e.g., decoupling or bypass capacitors) to a substrate, or to a device module, to address these concerns can consume module area, decreasing available area for input/output (I/O) circuitry and limiting the number of pass through-holes supported by the substrate. Some designs can address this problem by embedding discrete capacitors in the laminate of a substrate. This solution can, however, limit the number of pass through-holes in a design. Embedded discrete capacitors can also be sensitive to mechanical degradation due to localized stress and the environment surrounding the discrete capacitors.

Embodiments of this disclosure are based on the recognition that a substrate constructed with sheets of thin film capacitors affixed adjacent to a substrate core, or use instead of a substrate core, and modified to have pass through-holes formed through both the sheets of thin film capacitors and the substrate core, can improve the performance of electronic devices constructed using these substrates. A thin film capacitor sheet can be less susceptible to mechanical stress than embedded discrete capacitors due, at least in part, to the stresses being distributed along the area of the thin film capacitor sheet. Additionally, because pass through-holes are formed, or patterned, through the thin film capacitors sheets and the adjacent substrate core, this solution can be implemented without having to reduce the number of pass through-holes in a design.

As used herein, the terms coupled to, affixed to, and disposed on, refer to a physical connection between a first layer of material and a second layer of material. One or more intervening layers of materials (e.g., adhesive materials) be used to physically connect the first layer to the second layer.

As used herein, the terms above, adjacent to, below, and on refer to a position of a first layer of material relative to a second layer of material. In some embodiments, adjacent to can refer to a relative position between a first layer and a second layer, where minimum number of intervening layers separate the first layer and the second layer. A minimum number of intervening layers can, for example, be layers of material (e.g., an adhesive layer) required to affix or connect the first layer to the second layer.

As used herein, an opening can be a void, a cavity, a hole, or a bore. An opening in a material extends through at least two surfaces of the material.

As used herein, the term substrate refers to a solid material, or substance, onto which electrical devices (e.g., semiconductor chips), electrical circuits, passive and active electrical components, and one or more layers of other materials can be affixed. The term substrate can include a device substrate, packaging substrate, and printed circuit board substrates. A substrate can include a core material, or a core material of a substrate, composed of one or more layers on which other substrate layers are build. The core material can add structural support to a substrate, and can include material such a fire retardant glass fiber epoxy laminate.

According to various embodiments, a substrate can be constructed by affixing a capacitor sheet (e.g., a thin film capacitor sheet) adjacent to a core material of the substrate. Openings (e.g., first openings) can be patterned (e.g., drilled or cut) through both the capacitor sheet and the core material. The patterned openings can be larger than openings of pass though-holes specified, or selected, for the substrate. The openings can be filled with an electrically inert material (e.g., a resin). The electrically inert material can harden or solidify within the openings. A second set of openings can then be patterned though the hardened electrically inert material. The second set of openings can be parallel to the first openings and can extend through the electrically inert material. Additionally, the second set of openings can be at least as large as pass through-holes selected for the substrate, but smaller that the first set of openings to ensure that the sidewalls of each opening in the second set of openings is enclosed within, or surrounded by, the electrically inert material.

In some embodiments, the capacitor sheet can be a laminate having at least a conductive layer and a dielectric layer. The laminate can include several layers of conductive and dielectric material. The additional layers can improve the structural stability of the laminate, as well as enable larger capacitance values. In certain embodiments, the capacitor sheet can be patterned, prior to being affixed adjacent to the core material to form two or more capacitor sheets. The two or more capacitor sheets can be electrically isolated from each other. Each of the two or more capacitor sheets can then be affixed adjacent to the core material as electrically isolated capacitors.

In some embodiments, patterning the second set of opening can include drilling the openings with a drill. Patterning the second set of openings can further include cutting the openings with a laser.

The second set of openings can be pass through-holes, or resin filled pass through-holes, incorporated in the substrate and in the capacitor sheets. Electrical conductors, or electrically conductive material, can be deposited in the second set of openings as, for example, part of the substrate build up process.

According to various embodiments, a device substrate can be constructed, or created, by generating a core structure of the device substrate. The core structure can be a capacitor sheet (e.g., a thin film capacitor sheet or laminate). The capacitor sheet can include two or more alternating layers of conductive and dielectric material. Openings (e.g., first openings) can be patterned through the core structure. The patterned openings can be larger than openings of pass though-holes specified, or selected, for the substrate. The openings can be filled with an electrically inert material. The electrically inert material can harden or solidify within the openings. A second set of openings can then patterned though the hardened electrically inert material. The second set of openings can be parallel to the first openings and can extend through the electrically inert material. Additionally, the second set of openings can be at least as large as pass through-holes selected for the device substrate, but smaller that the first set of openings to ensure that the sidewalls of each opening in the second set of openings is enclosed within, or surrounded by, the electrically inert material. The device substrate can be further built up by depositing, adding, or affixing, one or more material layers to at least one surface of the core structure.

According to various embodiments, electrical conductors, or electrically conductive material, can be deposited in the second set of openings as, for example, part of the substrate build up process. In certain embodiments, openings can be made in at least one of the one or more material layers, and electrical conductors can be deposited within these openings as well as in the second set of openings.

According to various embodiments, a device substrate can include a core material with a capacitor sheet affixed adjacent to a surface of the core material. The capacitor sheet can cover, or substantially cover (e.g., cover a majority of), the surface of the core material. A set of openings (e.g., first openings) can extend through both the capacitor sheet and the core material. The set of openings can be larger than substrate pass through-holes selected for the device substrate. The set of openings can be filed with an electrically inter material. The electrically inert material can have a second set of openings extending parallel to the first openings through the electrically inert material. Additionally, the second set of openings can be at least as large as pass through-holes selected for the substrate, but smaller that the first set of openings to ensure that the sidewalls of each opening in the second set of openings is enclosed within, or surrounded by, the electrically inert material.

Referring now to the figures, FIG. 1 depicts a set of operations 100 for integrating thin film capacitor sheets adjacent to the core material of a device substrate, according to various embodiments. The operations 100 can be executed, performed, or carried out, as a part of a substrate build up process. As preliminary step, as substrate core can be generated, or prepared according to know substrate build up techniques. The operations 100 can be then be executed before additional layers or components are added to the substrate core.

At operation 105, a capacitor sheet can be affixed adjacent to the core material of a device substrate. The capacitor sheet can be a thin film capacitor laminate composed of at least a layer of conductive material and a layer of dielectric material. Examples of conductive materials include copper and nickel foils. Examples of dielectric materials include materials that have a high dielectric constant, such as barium titanate. In embodiments, the capacitor sheet can be a laminate composed of a layer of barium titanate disposed between a layer of copper foil and a layer of nickel foil. Some capacitor sheets can include two or more alternating conductor and dielectric layers. Other capacitor sheets can include two or more alternating insulator and dielectric layers collectively disposed between conductor layers. Capacitor sheets can typically be on the order of 30-200 micrometers thick. In certain embodiments, the capacitor sheet can have a capacitance on the order of 1-5 microfarads per square centimeter. A capacitor sheet affixed to a core material of a device substrate can have capacitance values on the order of 20 microfarads.

Affixing a capacitor sheet to a core material of a substrate can include depositing an adhesive coating or layer (e.g., adhesive copper) to a surface of the core material. A capacitor sheet (e.g., a laminate) patterned to over an area of the core material (e.g., the entire surface, or a majority of the entire surface) can then be disposed over the adhesive material.

In some embodiments, prior to affixing a copper sheet to a core material of a substrate, the copper sheet can be patterned to generate two or more electrically isolated copper sheets. The patterning can include cutting the copper sheet along one dimension of the sheet to generate two or more smaller sheets. Each of the two or more smaller sheets can then be affixed to the substrate core. Each of the two or more sheets can thus form capacitors that couple to two or more voltage domains.

At operation 110, openings (e.g., first openings) can be patterned through both the capacitor sheet and the core material. The openings (e.g., a diameter of the openings) can be larger than substrate pass through-holes selected, or specified, for the substrate. Patterning the openings can include drilling using a drill bit that creates holes larger than a pass through-hole selected for the substrate (e.g., a traditional pass through-hole). Patterning the openings can also include using a laser to cut holes larger than a pass through-hole selected for the substrate.

At operation 115, the openings can be filled with an electrically inert material. The electrically inert material can be a material that is initially fluidic, but later hardens, either on its own or after being cured. Filling the openings can include curing the inert material to cause it to solidify. Examples of an electrically inert material include resins, such as glass-epoxy materials.

At operation 120, openings (e.g., second openings) can be patterned through the electrically inert material. These second openings can be at least as large as substrate pass through-holes selected for the substrate, but smaller that the first set of openings to ensure that the sidewalls of each opening in the second set of openings is enclosed within, or surrounded by, the electrically inert material. In some embodiments, the second openings are substrate pass through-hole openings. In these embodiments, pass through-hole conductors can be deposited in the second openings subsequent to the drilling. The second openings can be patterned by drilling, using a drill, or by cutting, using a laser, as described herein.

Standard substrate processing techniques can further be used to drill or patter holes in the capacitor sheets to make electrical connections to power and ground legs.

Figure 2:
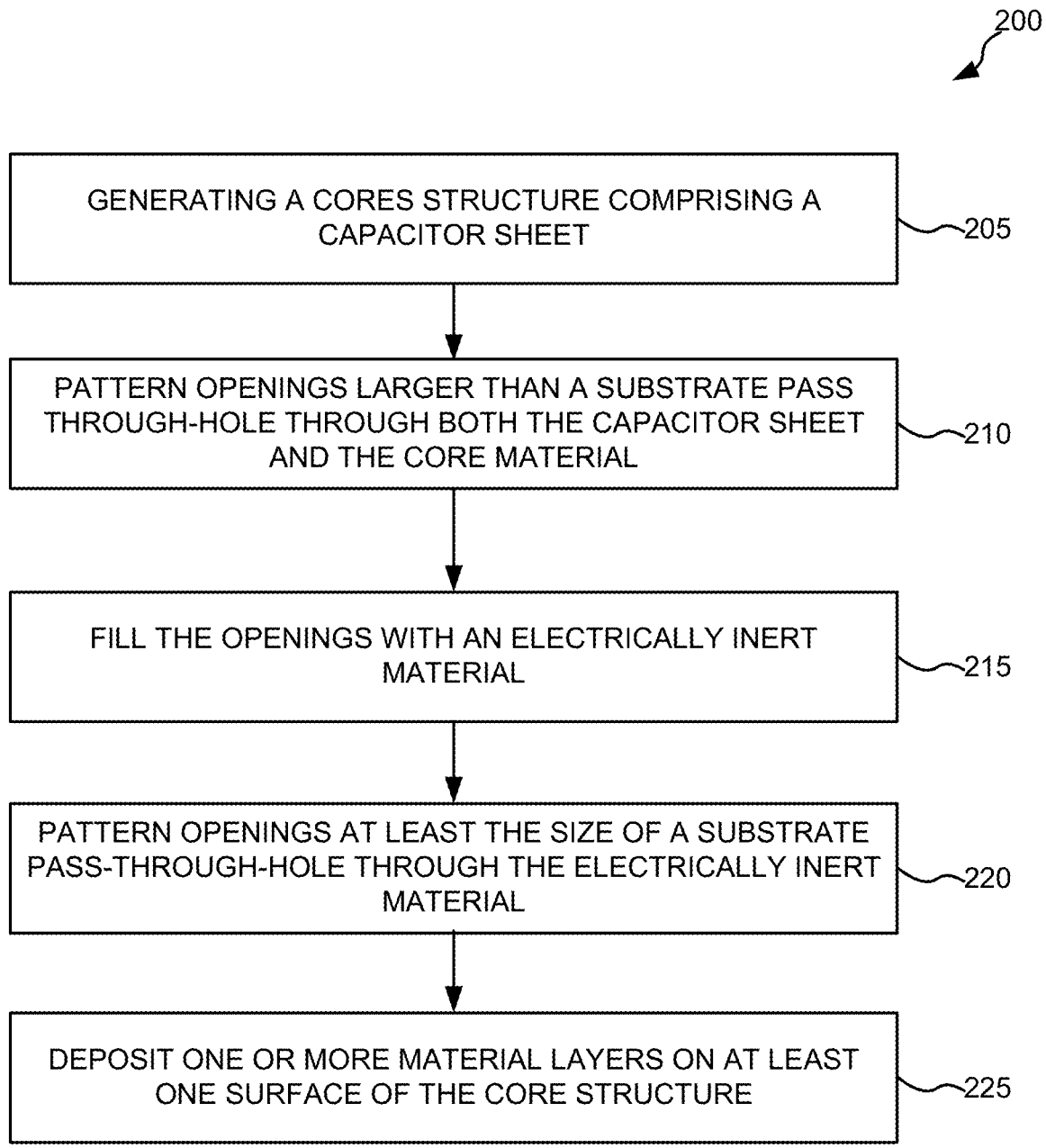
FIG. 2 depicts a set of operations for creating a device substrate having sheets of thin film capacitors as the core material, according to various embodiments.

FIG. 2 depicts a set of operations 200 for creating a device substrate having sheets of thin film capacitors as the core material, according to various embodiments. The operations 200 can be executed, performed, or carried out, as a part of a substrate build up process.

At operation 205, a core structure of the device substrate can be generated. The core structure can be composed of a capacitor sheet, or laminate, having at least a conductive layer and a dielectric layer. In some embodiments, the capacitor sheet can include two or more alternating conductor and dielectric layers, or two or more alternating insulator and dielectric layers collectively disposed between conductor layers. The additional layers can enable the capacitor sheet to have increased capacitance, as well as to provide structural support for the device substrate.

At operation 210, openings (e.g., first openings) can be patterned through the core structure. The openings can be larger than substrate pass through-holes selected, or specified, for the substrate. According to various embodiments, the openings can be patterned using a drill or laser, as described herein.

At operation 215, the openings can be filled with an electrically inert material, as described herein.

At operation 220, openings (e.g., second openings) can be patterned through the electrically inert material. The second set openings can be parallel to the first openings and can extend through the electrically inert material. Additionally, the second openings can be at least as large as pass through-holes selected for the device substrate, but smaller that the first openings to ensure that the sidewalls of the second openings are enclosed within, or surrounded by, the electrically inert material.

At operation 225, the device substrate can be further built up by depositing, adding or affixing one or more material layers to at least one surface of the core structure.

Figure 3:
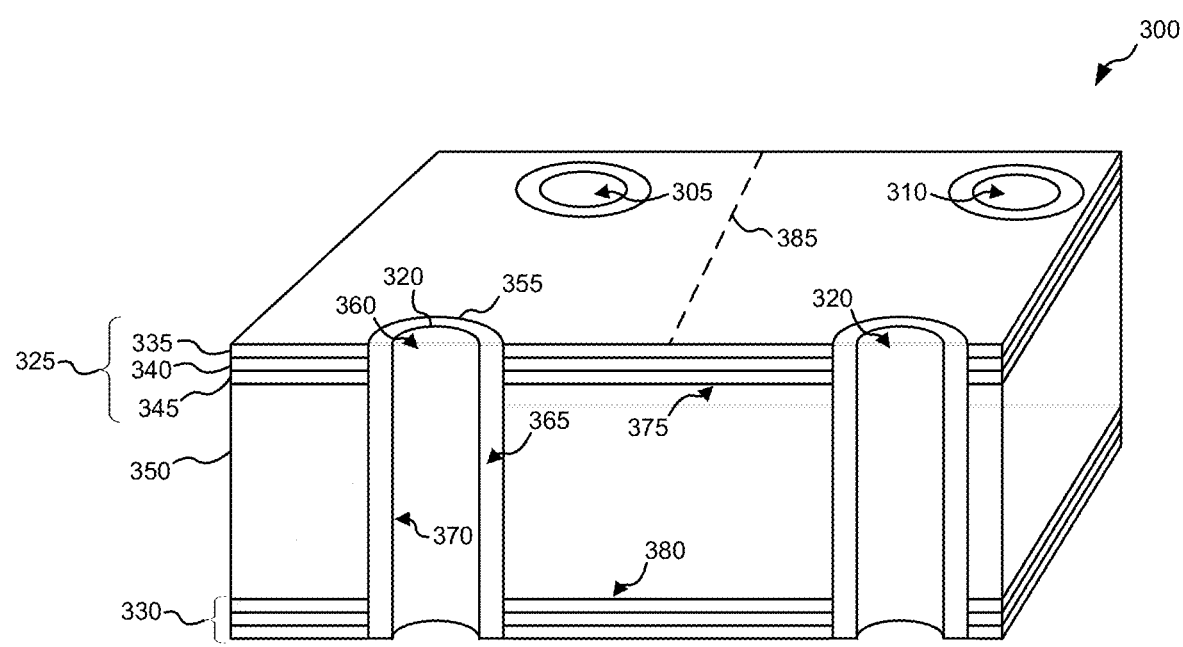
FIG. 3 depicts a block diagram of a sectioned perspective view of a device substrate integrating thin film capacitor sheets adjacent to the core material of a device substrate, according to various embodiments.

FIG. 3 depicts a block diagram of a sectioned perspective view of a device substrate 300 integrating thin film capacitor sheets 325 and 330 adjacent to core material 350, according to various embodiments.

Capacitor sheets 325 and 330 are a laminates having conductive layers 335 and 345, and dielectric layer 340. While the capacitor sheets 325 and 330 are depicted as having only three layers, the capacitor sheets can include two or more layers of alternating conductor, insulator, and dielectric materials, as described herein. In some embodiments the conductive layer 345 is an adhesive layer. According to various embodiments, the capacitor sheets 325 and 330 can be affixed to core material 350 as a single laminate. In certain embodiments, the capacitor sheets 325 and 330 can be patterned to cover a specific area of the substrate core 350, and to have a specific electrical characteristics (e.g., capacitance) prior to being affixed to the substrate core 350.

In some embodiments, the capacitor sheet 325, and the capacitor sheet 330, can include patterning 385. Patterning 385 can be a pre-patterned separation, or gap, dividing capacitor sheet 325 into a first capacitor sheet (e.g., the capacitor sheet having substrate pass through-holes 305 and 360) and a second capacitor sheet (e.g., the capacitor sheet having substrate pass through-holes 310 and 320).

The capacitor sheets 325 and 330 can be affixed to the core material 350 on, or over, the core material surface 375 and 380, respectively. In other embodiments, the substrate core 350 can be absent, and the capacitor sheets 325 and 330 can serve as a core structure of the device substrate 300.

The capacitor sheets 325 and 330 can include pass through-holes 305, 310, 320 and 360 extending through the capacitor sheets. Each of the pass through-holes 305, 310, 320 and 360 can be created, at least in part, by opening 355 (e.g., first opening) in the capacitor sheet 325 and 330, inert electrical material 365 filling the opening, and second opening 320 through the inert electrical material. Each of the pass through-holes 305, 310, 320 and 360 can additionally have sidewalls 370 surrounded by, or enclosed within, inert electrical material 365.

Figure 4:
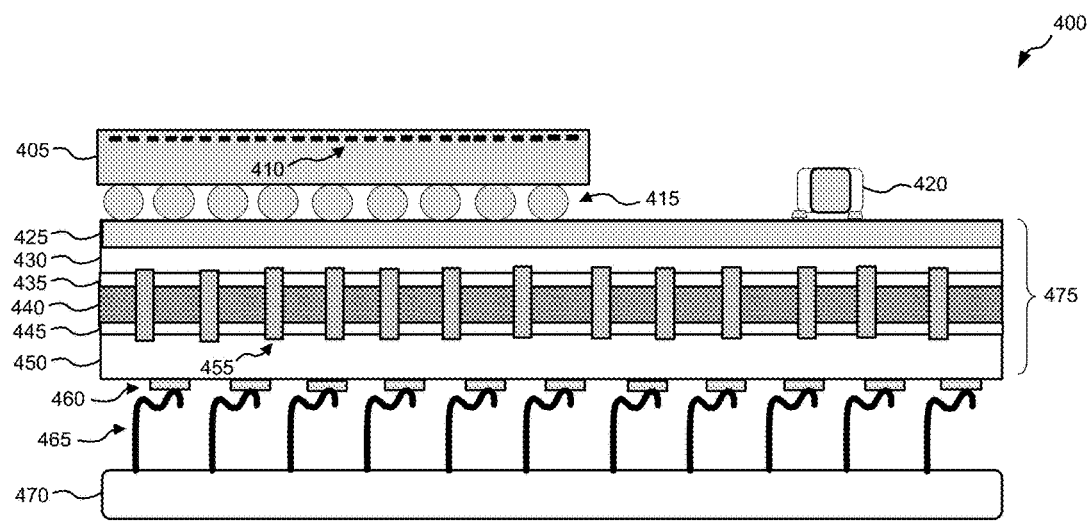
FIG. 4 depicts a block diagram of a cross-sectional view a device substrate integrating thin film capacitor sheets adjacent to the core material of a device substrate, according to various embodiments.

FIG. 4 depicts a block diagram of a cross-sectional view an electronic device 400 using a substrate integrating thin film capacitor sheets adjacent to the core material of a device substrate, according to various embodiments. The electronic device 400 includes substrate 475, semiconductor device 405 (e.g., a processor, logic circuit, amplifier, etc.) having metal insulator metal capacitors 410 and connected to solder mask 425 by controlled collapse chip connection 415. The electronic device 400 further includes top surface metallurgy capacitors 420. The substrate 475 includes build up layers 430 and 450. The substrate 475 further includes substrate core material 440 with affixed capacitor sheets 435 and 445. The substrate 475 further includes pass through holes 455 extending through the core material 440 and through the capacitor sheets 435 and 445. Land grid array pins 465 couple land grid array pads 460 to socket 470.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method of constructing a device substrate, the method comprising:
   affixing a capacitor sheet adjacent to a core material configured to form the device substrate, the capacitor sheet covering a surface of the core material;
   selecting a pass through-hole on the affixed capacitor sheet and the core material configured to form the device substrate;
   patterning first openings through the capacitor sheet and the core material, the first openings being larger than the pass through-hole;
   filling the first openings with an electrically inert material; and
   patterning second openings parallel to the first openings through the electrically inert material, the second openings being at least as large as the pass through-hole and having sidewalls enclosed within the electrically inert material.

2. The method of claim 1, further comprising:
   laminating the capacitor sheet, wherein the capacitor sheet comprises at least a conductive layer and a dielectric layer.

3. The method of claim 1, further comprising:
   prior to the affixing, patterning the capacitor sheet to form two or more capacitor sheets, and
   wherein the affixing comprises:
      affixing each of the two or more formed capacitor sheets adjacent to the core material.

4. The method of claim 1, wherein the electrically inert material is a resin.

5. The method of claim 1, wherein the second openings are a pass though-holes.

6. The method of claim 1, further comprising depositing pass through-hole conductors in the second openings.

7. The method of claim 1, wherein the capacitor sheet is a thin film capacitor sheet.

8. The method of claim 1, wherein the patterning includes providing at least one of a drill or laser to form the first openings.

* * * * *